(12) United States Patent
Lake (10) Patent No.: US 6,229,441 B1
(45) Date of Patent: *May 8, 2001

(54) COMMUNICATION DEVICES, RADIO FREQUENCY IDENTIFICATION DEVICES, METHODS OF FORMING A COMMUNICATION DEVICE, AND METHODS OF FORMING A RADIO FREQUENCY IDENTIFICATION DEVICE

(75) Inventor: Rickie C. Lake, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/513,297

(22) Filed: Feb. 25, 2000

Related U.S. Application Data (63) Continuation of application No. 08/969,625, filed on Nov. 13, 1997, now Pat. No. 6,043,745.

(51) Int. Cl.⁷ .................................................. G08B 13/14
(52) U.S. Cl. ..................... 340/572.1; 29/855; 340/572.7; 340/572.8
(58) Field of Search ............................. 340/572.1, 572.7, 340/572.8, 505, 10.1; 361/748, 760, 772, 774, 777, 779; 29/825, 829, 846, 854, 855; 257/679

(56) References Cited

U.S. PATENT DOCUMENTS

| 4,075,632 | 2/1978 | Baldwin et al. ........................ 343/6.8 |
| 4,926,182 | 5/1990 | Ohta et al. .............................. 342/44 |
| 5,528,222 | 6/1996 | Moskowitz et al. .............. 340/572.7 |
| 5,566,441 | 10/1996 | Marsh et al. ............................ 29/600 |
| 5,621,412 | 4/1997 | Sharpe et al. ........................... 342/51 |
| 5,649,296 | 7/1997 | MacLellan et al. ................ 455/38.2 |
| 5,682,143 | 10/1997 | Brady et al. ....................... 340/572.7 |
| 5,786,626 | 7/1998 | Brady et al. ........................... 257/673 |
| 5,861,662 | * 1/1999 | Candelore ........................... 257/679 |
| 6,043,745 | * 3/2000 | Lake .................................. 340/572.1 |

* cited by examiner

*Primary Examiner*—Thomas Mullen
(74) *Attorney, Agent, or Firm*—Wells, St. John, Roberts, Gregory & Matkin, P.S.

(57) ABSTRACT

The present invention provides electronic devices and methods of forming electronic devices. One embodiment of the present invention provides an electronic device which includes a substrate having a support surface; a first conductor over the support surface of the substrate, the first conductor including a predetermined portion which defines a first area and a second area of the support surface; at least one electrical component coupled with the first conductor; and a second conductor comprising a conductive adhesive, the second conductor being positioned over the support surface of the substrate and across the predetermined portion of the first conductor, the conductive adhesive being configured to electrically couple the first area with the second area.

42 Claims, 4 Drawing Sheets

COMMUNICATION DEVICES, RADIO FREQUENCY IDENTIFICATION DEVICES, METHODS OF FORMING A COMMUNICATION DEVICE, AND METHODS OF FORMING A RADIO FREQUENCY IDENTIFICATION DEVICE

RELATED PATENT DATA

This patent resulted from a continuation application of U.S. patent application Ser. No. 08/969,625, filed Nov. 13, 1997, which is now U.S. Pat. No. 6,043,745 issued Mar. 28, 2000, entitled "Electronic Devices and Methods of Forming Electronic Devices", naming Rickie C. Lake as inventor, the disclosure of which is incorporated by reference.

TECHNICAL FIELD

The present invention relates to electronic devices and methods of forming electronic devices.

BACKGROUND OF THE INVENTION

Electronic identification systems typically comprise two devices which are configured to communicate with one another. Preferred configurations of the electronic identification systems are operable to provide such communications via a wireless medium.

One such configuration is described in U.S. Pat. No. 6,130,602 issued Oct. 10, 2000, assigned to the assignee of the present application and incorporated herein by reference. This application discloses the use of a radio frequency (RF) communication system including communication devices. The disclosed communication devices include an interrogator and a transponder, such as a tag or card.

Such communication systems can be used in various identification functions and other applications. The interrogator is configured to output a polling signal which may comprise a radio frequency signal including a predefined code. The transponders of such a communication system are operable to transmit an identification signal responsive to receiving an appropriate command or polling signal. More specifically, the appropriate transponders are configured to recognize the predefined code. The transponders receiving the code subsequently output a particular identification signal which is associated with the transmitting transponder. Following transmission of the polling signal, the interrogator is configured to receive the identification signals enabling detection of the presence of corresponding transponders.

Such communication systems are useable in identification, applications such as inventory or other object monitoring. For example, a remote identification device is attached to an object of interest. Responsive to receiving the appropriate polling signal, the identification device is equipped to output an identification signal. Generating the identification signal identifies the presence or location of the identification device and the article or object attached thereto.

Given the nature of use of such electronic devices (i.e., attachment of the transponder to other devices or objects), it is preferred to minimize the size of the electronic device. Minimizing the size of the device imparts less impact upon the goods being tracked. In addition, providing an electronic device of reduced size permits the electronic device to be utilized with smaller items to be tracked in inventory. Compact electronic devices also have cosmetic and utilitarian advantages over larger conventional communication devices.

Providing electronic devices of such reduced size requires the use of compact components and closely spaced, high definition interconnections for those components within the electronic device. In addition it is necessary to adequately insulate all interconnections to provide proper operation of the electronic device despite the high definition conductors and reduced size.

Therefore, it is desirable to provide an electronic device which achieves the benefits of compact design while overcoming problems associated therewith.

SUMMARY OF THE INVENTION

According to one aspect, the present invention provides an electronic device including a substrate having a first conductor. A portion of the first conductor defines a first area and a second area. The electronic device includes an electronic component and a second conductor which comprises a conductive adhesive configured to electrically couple the first area with the second area. The substrate is flexible according to some embodiments. Additionally, a dielectric is provided intermediate the first area and the second area in one embodiment. The dielectric is operable to electrically insulate the first conductor.

A second aspect of the present invention provides an apparatus configured to conduct electricity. The conductive apparatus includes a first conductor which defines a first area and a second area of a substrate support surface. A dielectric is provided over a portion of the first conductor intermediate the first area and the second area. A second conductor comprising an adhesive configured to conduct electricity from the first area to the second area is provided upon the dielectric.

Another aspect of the present invention provides a wireless identification device. The wireless identification device includes a flexible substrate configured to support a conductive pattern which includes a plurality of conductors. The device includes an electrical component coupled with the conductive pattern and a dielectric layer over a predetermined portion of the conductive pattern. Further, a conductive adhesive is provided to couple plural conductors of the conductive pattern. Plural electrical components including power sources and integrated circuitry are provided according to some embodiments.

The present invention also provides methods of forming an electronic device. One method includes the steps of providing a substrate having a support surface and forming a first conductor over the support surface. A second conductor is formed over the support surface of the substrate and comprises an adhesive operable to conduct electricity. The first conductor defines a first area and a second area of the support surface of the substrate and the second conductor conducts electricity intermediate the defined first area and the second area.

Another method of the present invention provides forming a remote intelligent communication device. The method includes forming a conductive pattern including a plurality of conductors over a support surface of the substrate and coupling at least one electrical component with the conductive pattern. Further, the method includes forming a dielectric layer over the conductive pattern, providing a conductive adhesive over the dielectric layer and coupling plural conductors of the conductive pattern using the conductive adhesive.

A method of conducting electricity according to the present invention includes the step of forming a first conductor over a support surface of the substrate to define a first area adjacent a first side of the first conductor and a second area adjacent a second side of the first conductor. The method also includes conducting electricity from the first area to the second area using a conductive adhesive and insulating the first conductor from the conductive adhesive using a dielectric layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The present invention provides various embodiments of electronic devices and apparatuses configured to conduct electricity. Some embodiments of the electronic devices include electronic communication devices including wireless identification devices. The present invention also provides methods of forming electronic devices and remote intelligent communication devices. Further, the present invention discloses methods of conducting electricity.

Exemplary electronic communication devices include radio frequency identification devices (RFID) and remote intelligent communication devices (RIC). A remote intelligent communication device is capable of functions other than the identifying function of a radio frequency identification device. A preferred remote intelligent communication device includes a processor. Such communication devices are implemented in card configurations (such as tags or stamps) according to described aspects of the present invention. The disclosed embodiments are illustrative and other configurations according to the present invention are possible. Although the present invention is described with reference to a communication system, the present invention may be implemented in other configurations.

Figure 1:
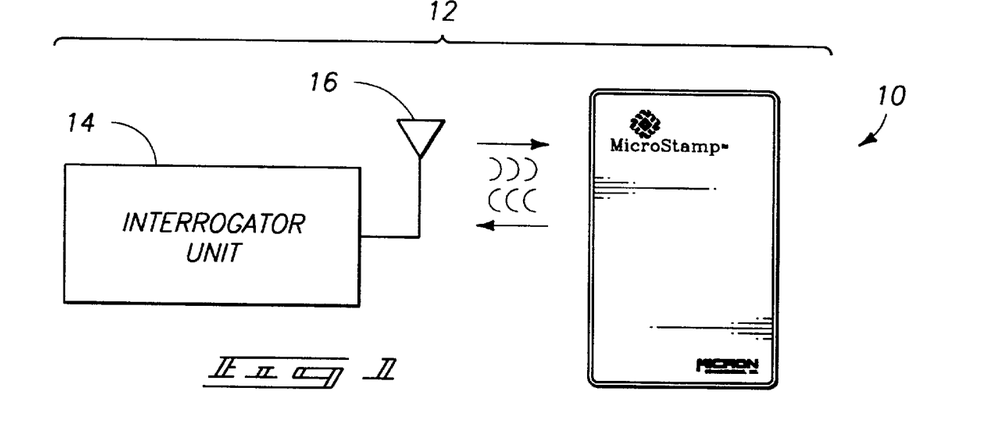
FIG. 1 is an illustrative diagram of one embodiment of a communications system comprising plural electronic devices.

Referring to FIG. 1, a communication system 12 is illustrated. The depicted communication system 12 includes an electronic communication device 10, such as a remote intelligent communication device, and an interrogator unit 14. An exemplary communication system 12 is described in U.S. patent application Ser. No. 08/705,043, filed Aug. 29, 1996, assigned to the assignee of the present application and incorporated herein by reference. An exemplary interrogator 14 is described in detail in U.S. patent application Ser. No. 08/806,158, filed Feb. 25, 1997, now abandoned, assigned to the assignee of the present application and incorporated herein by reference.

The electronic device 10 is configured to communicate via electronic signals with interrogator unit 14. Preferably, device 10 communicates with unit 14 via wireless electronic signals, such as radio frequency (RF) signals. Wireless electronic signals or radio frequency signals, such as microwave signals, are utilized for communications in the preferred embodiment of communication system 12. Communication system 12 further includes an antenna 16 coupled to the interrogator unit 14 to facilitate communications.

Figure 2:
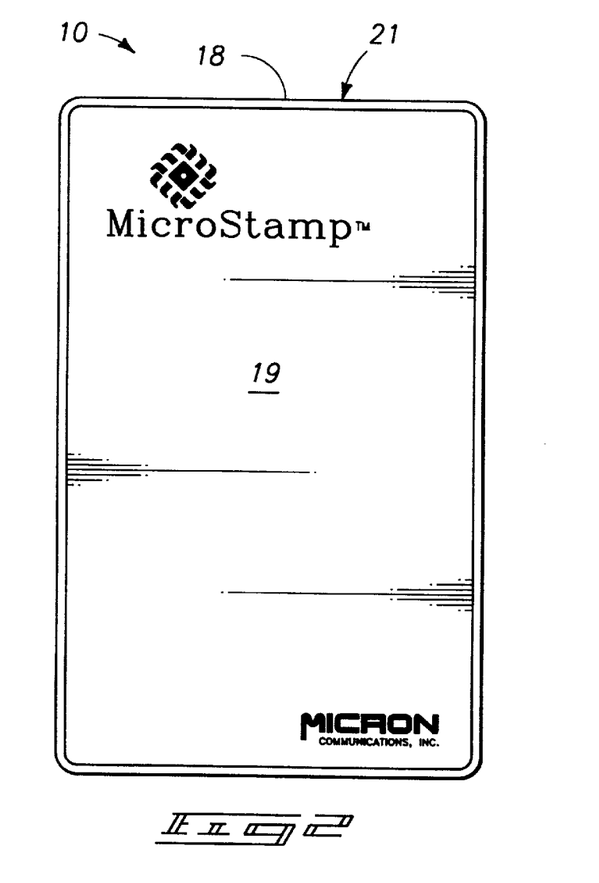
FIG. 2 is a front elevational view of an embodiment of an electronic communication device of the communication system.

Referring to FIG. 2, the illustrated electronic device 10 includes an insulative layer of supportive material, also referred to as substrate 18. Example materials for substrate 18 comprise polyester, polyethylene or polyamide film having a thickness of 4–6 mils (thousandths of an inch). Substrate 18 is flexible in preferred embodiments. The substrate 18 defines a first portion of a housing for the electronic communication device 10. A front surface 19 of substrate 18 and electronic device 10 is shown in FIG. 2.

Figure 3:
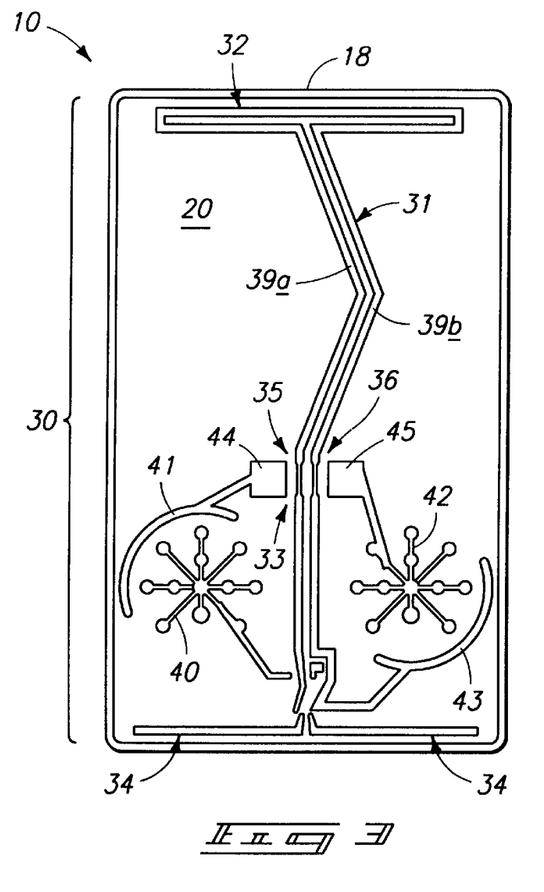
FIG. 3 is a front elevational view of the electronic communication device at an intermediate processing step.

Referring to FIG. 3, electronic device 10 is shown at an intermediate processing step. Substrate 18 includes a support surface 20 opposite front surface 19. A patterned conductive trace 30 is formed or applied over the substrate 18 and atop the support surface 20. Conductive trace or pattern 30 may be alternatively formed upon an ink layer, if such is provided upon support surface 20 of substrate 18.

A preferred conductive pattern 30 comprises printed conductive polymer thick film (PTF). A suitable polymer thick film is EMCA REMEX P2607. The printed polymer thick film comprises silver and polyester dissolved into a solvent. One manner of forming or applying the conductive pattern 30 is to screen or stencil print the ink on the support surface 20 through conventional screen printing techniques. The printed polymer thick film is preferably heat cured to flash off the solvent. An exemplary thickness of the polymer thick film is approximately 1 mil.

The conductive pattern 30 forms desired electrical connections with and between electronic components which will be described below. In one embodiment, substrate 18 forms a portion of a larger roll of polyester film material used to manufacture multiple devices 10. In such an embodiment, the printing of conductive pattern 30 can take place simultaneously for a number of the to-be-formed wireless communication devices.

The illustrated conductive pattern 30 provides antennas 32, 34 which are suitable for individually receiving and transmitting electromagnetic signals or RF energy.

Other antenna constructions are possible. In other exemplary embodiments, antennas 32, 34 are omitted and a loop antenna is provided to both receive and transmit electronic signals. The illustrated conductive pattern 30 includes a first conductor 31 configured to form and electrically couple antenna 32 with an integrated circuit 64 (shown in FIG. 4). First conductor 31 comprises two connection portions 39a, 39b intermediate antenna 32 and integrated circuit 64. First conductor 31 forms or defines two areas 35, 36 upon substrate 18.

Conductive trace or pattern 30 provides plural terminals 40–43 and pads 44, 45 in the illustrated embodiments. The illustrated terminals 40–43 and pads 44, 45 are conductors operable to conduct operational power for electronic device 10.

One portion of conductor 31 includes a substantially consistent width. The depicted first conductor 31 includes a predetermined portion or thin region 33 intermediate the pads 44, 45 and areas 35, 36 of substrate 18. The width of individual connections 39a, 39b of conductor 31 is reduced within the portion 33 compared with the width of the one or remaining portions of conductor 31 in the described embodiment. One embodiment of communication device 10 is configured for radio frequency communications. Providing the predetermined portion 33 of conductor 31 having a reduced width enhances the radio frequency communication characteristics of such a communication device. If embodied as a wireless communication device, electronic device 10 may include a ground plane to improve communications.

Alternatively, electronic device 10 is embodied in another configuration in accordance with the present invention. Further, other embodiments of the invention provide the first conductor 31 having a constant or increased width.

The terminals 40–43 of conductive pattern 30 comprise power source connection terminals or conductors in the depicted embodiment. An anode terminal 40 and a cathode terminal 41 are provided for connection with a first power source 60 (shown in FIG. 4). An anode terminal 42 and a cathode terminal 43 are provided for connection with a second power source 62 (also shown in FIG. 4). Terminals 40–43 are formed on support surface 20 of substrate 18 in the illustrated embodiment. Conductive pattern 30 provides electrical connection of the power sources 60, 62 to an integrated circuit 64. In one embodiment, integrated circuit 64 includes a receiver, modulator, memory, and microprocessor as described in the above-incorporated U.S. patent application Ser. No. 08/705,043.

Figure 4:
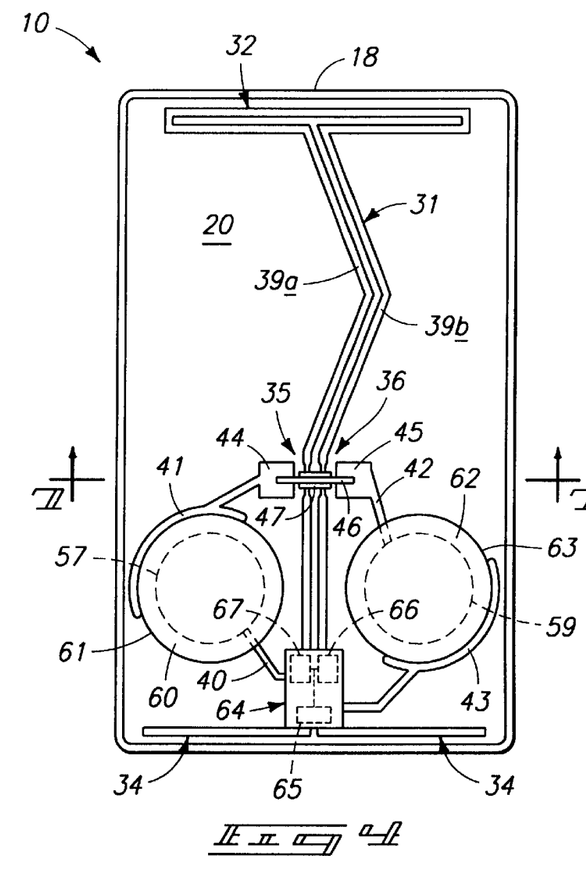
FIG. 4 is a front elevational view of the electronic communication device at an intermediate processing step downstream of the step shown in FIG. 3.

Referring to FIG. 4, electrical components of the illustrated electronic device 10 include power sources 60, 62 and integrated circuit 64. The electrical components are individually mounted on support surface 20 and supported by substrate 18. Passive components (e.g., capacitors) may also be supported and mounted upon the support surface 20.

Power sources 60, 62 are coupled in serial in the described embodiment and provide operational power to other electrical components within electronic device 10, including integrated circuit 64. In the illustrated embodiment, power sources 60, 62 are batteries. The batteries are preferably thin profile batteries which include first and second terminals of opposite polarity. More particularly, the batteries individually have a lid or negative (i.e., ground) terminal or electrode, and a can or positive (i.e., power) terminal or electrode.

Conductive epoxy is applied over desired areas of the support surface 20 using conventional printing techniques, such as stencil printing, to assist in component attachment described just below. Alternately, solder or another conductive material is employed instead of conductive epoxy.

Power sources 60, 62 and integrated circuit 64 are provided and conductively bonded on the support surface 20 using the conductive epoxy. Integrated circuit 64 can be mounted either before or after the power sources 60, 62 are mounted on the support surface 20.

Terminals 40–43 are coupled with appropriate terminals of power sources 60, 62 via conductive epoxy in accordance with a preferred embodiment of the invention. Conductive epoxy electrically connects terminal 40 with the negative (i.e., lid) terminal 57 of the first power source 60. The negative terminal 57 of power source 60 is shown in phantom in FIG. 4. In particular, power source 60 is placed lid down such that the conductive epoxy makes electrical contact between the negative terminal 57 of the power source 60 and the first terminal 40 of the conductive pattern 30. Second power source 62 is also applied lid down providing electrical contact of a negative terminal 59 thereof with terminal 42. Terminal 59 is also shown in phantom in FIG. 4.

Power sources 60, 62 have respective perimetral edges 61, 63 defining respective power source terminals. Perimetral edges 61, 63 are disposed adjacent respective connection terminals 41, 43. In the illustrated embodiment, terminals or perimetral edges 61, 63 of the power sources 60, 62 are cylindrical. Connection terminals 41, 43 are arcuate and individually have radii slightly greater than the radius of the power sources 60, 62. In the illustrated embodiment, connection terminals 41, 43 are closely spaced apart from respective terminals or perimetral edges 61, 63 of power sources 60, 62.

Subsequently, conductive epoxy is dispensed relative to perimetral edges 61, 63 and electrically connects the edges 61, 63 with respective connection terminals 41, 43. In the illustrated embodiment, the perimetral edges 61, 63 define the can of the respective power sources 60, 62, such that the conductive epoxy connects the positive terminals of the power sources 60, 62 to connection terminals 41, 43, respectively. The conductive epoxy connects negative terminals 57, 59 to connection terminals 40, 42, respectively. The conductive epoxy is then cured.

The power sources 60, 62 are electrically coupled together in series in the described embodiment. In particular, the positive terminal of the first power source 60 is coupled with the negative terminal of the second power source 62. Pads 44, 45 are electrically coupled with respective terminals 41, 42. A conductive interconnect or second conductor 46 provides electrical coupling of pads 44, 45 in accordance with the described embodiment of the present invention. Second conductor 46 elevationally extends across first conductor 31 to implement electrical coupling of power sources 60, 62 in the depicted embodiment.

Figure 5:
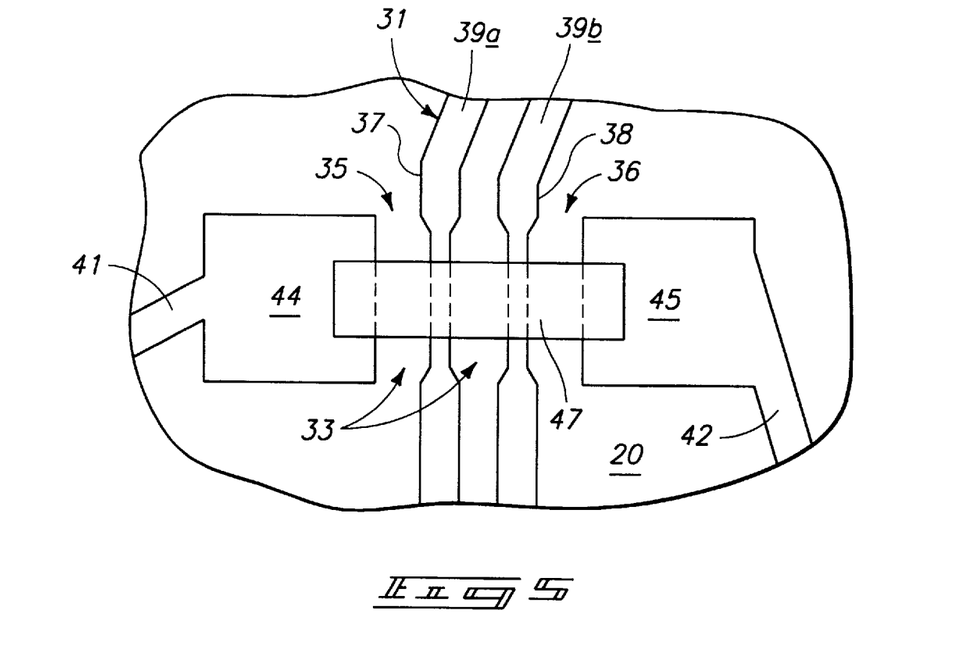
FIG. 5 is a front elevational view of a portion of a conductive pattern of the electronic communication device at an intermediate processing step.

Referring to FIG. 5, a dielectric layer 47 is formed over portions 39a, 39b of first conductor 31. Dielectric layer 47 provides electrical insulation of first conductor 31. As shown in the illustrated embodiment, dielectric layer 47 is formed intermediate pads 44, 45 and first area 35 and second area 36 of substrate 18. Dielectric layer 47 is provided over predetermined portions 33 of first conductor 31 by screen printing in one embodiment.

The described dielectric layer 47 comprises a UV curable acrylic. Other dielectric materials are utilized in other embodiments. A suitable material for forming dielectric layer 47 has product designation 5018 and is available from E. I. duPont de Nemours and Company. An exemplary thickness of dielectric layer 47 is 2 mils.

Figure 6:
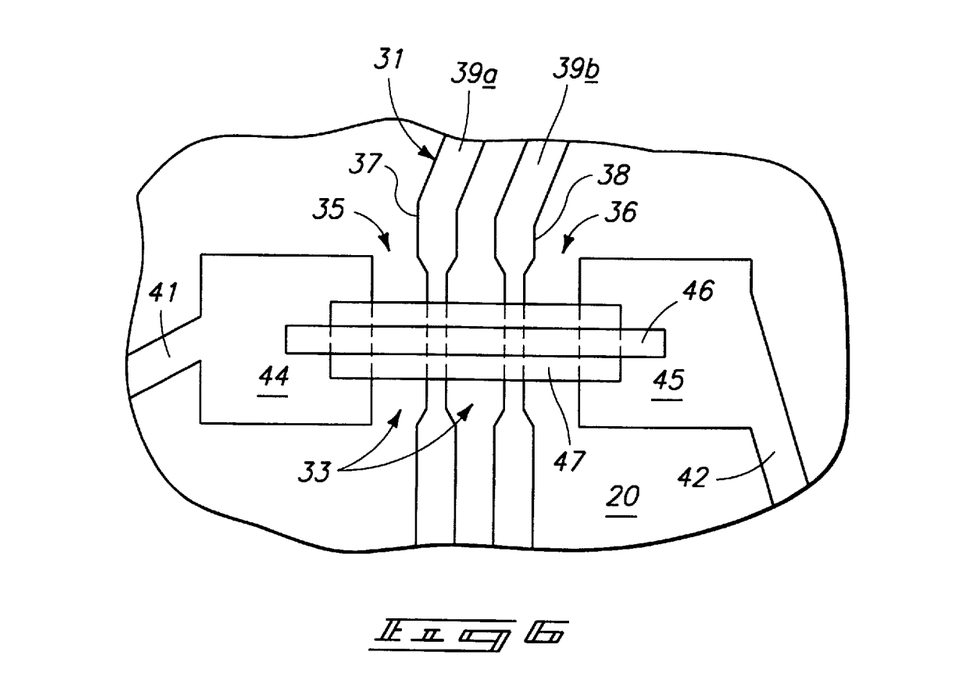
FIG. 6 is a front elevational view of the portion of the conductive pattern shown in FIG. 5 at an intermediate process step downstream of the step shown in FIG. 5.

Referring to FIG. 6, interconnect or second conductor 46 is provided to electrically couple pads 44, 45, and areas 35, 36 adjacent opposing first and second sides 37, 38 of respective connection portions 39a, 39b of first conductor 31. In a preferred embodiment, second conductor 46 comprises a conductive adhesive, such as conductive epoxy. An exemplary conductive adhesive includes a silver epoxy resin having designation 116-37A and a hardener having designation B187, available from Creative Materials Inc. of Tyngsboro, Mass. Utilization of conductive adhesive in the formation of second conductor 46 facilitates fabrication of electronic device 10 inasmuch as second conductor 46 may be simultaneously formed during the provision of conductive adhesive or epoxy upon preselected portions of surface 20 for attaching electrical components to substrate 18 and conductive pattern 30. Second conductor 46 is over connection portions 39a, 39b of first conductor 31 in the illustrated embodiment. In other embodiments, second conductor 46 is provided over a single conductor or more than two conductors.

Referring again to FIG. 4, first terminal 41 couples the positive terminal of power source 60 with pad 44. Second conductor 46 couples pad 44 with pad 45 providing power from power source 60 to pad 45. Terminal 42 couples pad 45 with the anode of power source 62 implementing the serial configuration of the described embodiment.

Terminals 40, 43 of conductive pattern 30 are coupled with integrated circuit 64 providing an electrical ground reference and operational power to circuitry within integrated circuit 64, respectively. Antennas 32, 34 are coupled with the integrated circuit 64 providing electrical connection therebetween for the transfer of signals corresponding to the wireless electronic signals or RF energy transmitted and received by antennas 32, 34.

One embodiment of integrated circuit 64 includes suitable communication circuitry for providing wireless communications capabilities within electronic communication device 10. For example, in one embodiment, integrated circuit 64 includes a microprocessor 65, memory 66, and transponder circuitry 67 in cooperation with one another for providing wireless communications with interrogator unit 14. An exemplary and preferred integrated circuit 64 is described in U.S. patent application Ser. No. 08/705,043 incorporated by reference above.

One embodiment of the communication circuitry or transponder circuitry 67 includes a modulator, such as a transmitter, and a receiver operable to respectively communicate (i.e., output) and receive wireless electronic signals. The processor 65 is coupled with transponder circuitry 67 and is configured to process the electronic signals. Responsive to the detection of an appropriate polling signal, processor 65 instructs modulator transponder circuitry 67 to output an identification signal. The wireless electronic signals are communicated via antennas 32, 34 in the illustrated embodiment.

The receiver of transponder circuitry 67 is configured to receive electromagnetic signals (e.g., in a wireless fashion) and the modulator is configured to output or communicate electromagnetic signals (e.g., in a wireless fashion). The modulator comprises an active transmitter or a backscatter device according to certain embodiments. Such outputting or communicating of the electronic signals via the modulator comprises one of transmitting the electronic signals and reflecting received signals. Typically, the modulator is configured to communicate an identification signal responsive to the reception of an appropriate polling signal. The identification signal outputted via the modulator identifies the particular device 10 communicating the identification signal in accordance with one embodiment of the present invention.

Figure 7:
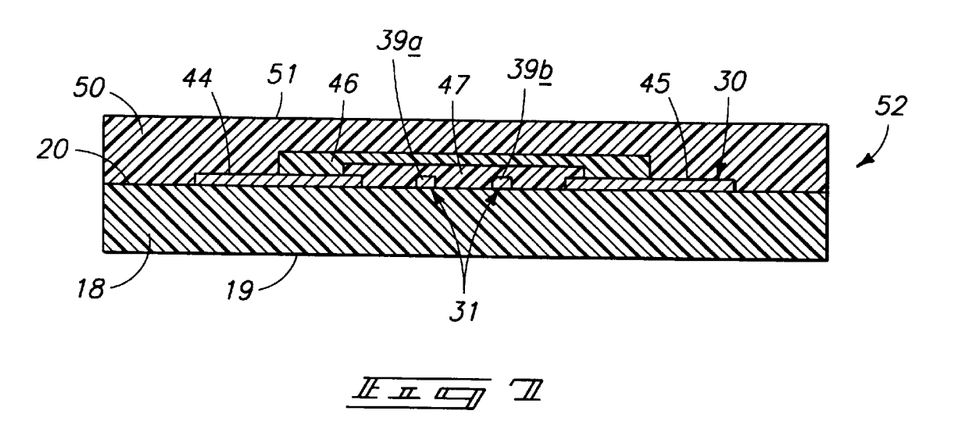
FIG. 7 is a cross-sectional view taken along line 7—7 of the electronic communication device shown in FIG. 4.

Referring to FIG. 7, an encapsulant 50, such as an encapsulating epoxy resin material, is subsequently formed to encapsulate a portion of the substrate 18. Although not shown in FIG. 7, resin encapsulant 50 covers integrated circuit 64, power sources 60, 62, and conductive circuitry 30 in one embodiment. Resin encapsulant 50 and substrate 18 define a housing 52 of the electronic device 10. Substrate 18 defines a front surface 19 of electronic device 10 and encapsulant 50 defines a back surface 51 of electronic device 10. In one embodiment, housing 52 of electronic device 10 has a length of about 3.375 inches, a width of about 2.125 inches, and a thickness less than or equal to about 0.0090 inches.

An exemplary resin encapsulant 50 is a flowable encapsulant. The flowable encapsulant 50 is flowed to encapsulate substrate 18. Encapsulant 50 is subsequently cured following the appropriate covering of the integrated circuit 64, power sources 60, 62, conductive circuitry 30, and support surface 20 of substrate 18. In the described embodiment, the curing of encapsulant 50 forms the composite substrate or solid housing 52 which comprises substrate 18 and encapsulant 50.

In the exemplary embodiment, such epoxy encapsulant 50 constitutes a two-part epoxy having a resin and a hardener which are sufficient to provide a desired degree of flexible rigidity. Further details regarding encapsulation of electronic device 10 are described in U.S. Pat. No. 5,988,510 issued Nov. 23, 1999, assigned to the assignee of the present application, and incorporated herein by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A communication device comprising:
   a substrate having a support surface;
   a first conductor supported by the substrate; and
   a second conductor comprising a conductive adhesive configured to electrically couple an area adjacent one side of the first conductor with another area adjacent an opposite side of the first conductor; wherein the second conductor is substantially electrically insulated from the first conductor at a region intermediate the coupled areas.

2. The device according to claim 1 further comprising an electrical component coupled with at least one of the first conductor and the second conductor.

3. The device according to claim 2 wherein the electrical component comprises wireless communication circuitry.

4. The device according to claim 2 wherein the electrical component comprises radio frequency identification device communication circuitry.

5. The device according to claim 1 further comprising a dielectric layer intermediate the first conductor and the second conductor.

6. The device according to claim 1 wherein the first conductor comprises a polymer thick film.

7. A communication device comprising:
   a substrate having a support surface;
   a first conductor over the support surface;
   a second conductor over the support surface and intersecting the first conductor to couple respective areas adjacent opposite sides of the first conductor and to define an intersection; wherein the second conductor is substantially electrically insulated from the first conductor at the intersection of the first conductor and the second conductor; and
   an electrical component comprising wireless communication circuitry coupled with at least one of the first conductor and the second conductor.

8. The device according to claim 7 wherein the electrical component comprises radio frequency identification device communication circuitry.

9. The device according to claim 7 wherein the second conductor comprises a conductive adhesive.

10. The device according to claim 7 further comprising a dielectric layer intermediate the first conductor and the second conductor.

11. The device according to claim 7 wherein the first conductor comprises a polymer thick film.

12. A radio frequency identification device comprising:
   a substrate;
   a conductor over the substrate;
   an electrical component; and
   conductive adhesive over the substrate and including a first portion over the conductor to couple respective areas adjacent opposite sides of the conductor and a second portion adapted to electrically couple with the electrical component.

13. The device according to claim 12 wherein the electrical component comprises radio frequency identification device communication circuitry.

14. The device according to claim 12 further comprising a dielectric layer intermediate the first conductor and the second conductor.

15. The device according to claim 12 wherein the first conductor comprises a polymer thick film.

16. A method of forming a communication device comprising:
   providing a substrate;
   providing a first conductor over the substrate;
   providing a second conductor over the substrate configured to electrically couple respective areas adjacent opposite sides of the first conductor;
   substantially electrically insulating the first conductor and the second conductor intermediate the areas; and
   coupling an electrical component comprising wireless communication circuitry with at least one of the first conductor and the second conductor.

17. The method according to claim 16 wherein the insulating step comprises providing a dielectric layer intermediate the first conductor and the second conductor.

18. The method according to claim 16 wherein the step of providing the second conductor comprises forming using a conductive adhesive.

19. The method according to claim 16 wherein the coupling step comprises coupling an electrical component comprising radio frequency identification device communication circuitry.

20. The method according to claim 16 wherein the step of providing the first conductor comprises providing using a polymer thick film.

21. A method of forming a communication device comprising:
   providing a substrate;
   providing a conductor over the substrate;
   providing a conductive adhesive over at least one portion of the substrate to electrically couple respective areas adjacent opposite sides of the conductor and the conductive adhesive being substantially electrically insulated from the conductor at a location intermediate the respective areas; and
   coupling an electrical component with at least one of the conductor and the conductive adhesive.

22. The method according to claim 21 wherein the step of providing the conductive adhesive comprises providing a first portion of the conductive adhesive over the conductor to electrically couple the respective areas adjacent opposite sides of the conductor, and the coupling comprises coupling the electrical component with a second portion of the conductive adhesive.

23. The method according to claim 21 further comprising providing a dielectric layer intermediate the conductor and the conductive adhesive and intermediate the respective areas adjacent the opposite sides.

24. The method according to claim 21 wherein the coupling step comprises coupling an electrical component comprising wireless communication circuitry.

25. The method according to claim 21 wherein the coupling step comprises coupling an electrical component comprising radio frequency identification device communication circuitry.

26. The method according to claim 21 wherein the step of providing the conductor comprises providing using a polymer thick film.

27. A method of forming a radio frequency identification device comprising:
   providing a substrate;
   providing a conductor over the substrate;
   providing conductive adhesive over the substrate including providing a first portion of conductive adhesive over the conductor to electrically couple respective areas adjacent opposite sides of the conductor, wherein the first portion of the conductive adhesive is substantially electrically insulated from the conductor intermediate the areas; and
   coupling an electrical component comprising radio frequency identification device communication circuitry with a second portion of the conductive adhesive.

28. The method according to claim 27 further comprising providing a dielectric layer intermediate the conductor and the first portion of the conductive adhesive to substantially electrically insulate the conductor and the first portion of the conductive adhesive.

29. The method according to claim 27 wherein the step of providing the conductor comprises providing using a polymer thick film.

30. A communication device comprising:
   a substrate having a support surface;
   a first conductor supported by the substrate;
   a second conductor configured to electrically couple an area adjacent one side of the first conductor with another area adjacent an opposite side of the first conductor; wherein the second conductor is substantially electrically insulated from the first conductor at a region intermediate the coupled areas; and
   an electrical component comprising wireless communication circuitry coupled with at least one of the first conductor and the second conductor.

31. The device of claim 30 wherein the wireless communication circuitry comprises radio frequency identification device circuitry.

32. A communication device comprising:
   a substrate having a support surface;
   a first conductor supported by the substrate;
   a second conductor configured to electrically couple an area adjacent one side of the first conductor with another area adjacent an opposite side of the first conductor; wherein the second conductor is substantially electrically insulated from the first conductor at a region intermediate the coupled areas; and a dielectric layer intermediate the first conductor and the second conductor.

33. A communication device comprising:

a substrate having a support surface;

a first conductor comprising a polymer thick film supported by the substrate; and a second conductor configured to electrically couple an area adjacent one side of the first conductor with another area adjacent an opposite side of the first conductor; wherein the second conductor is substantially electrically insulated from the first conductor at a region intermediate the coupled areas.

34. A communication device comprising:

a substrate having a support surface;

a first conductor over the support surface;

a second conductor over the support surface and intersecting the first conductor to couple respective areas adjacent opposite sides of the first conductor and to define an intersection; and a dielectric layer intermediate the first conductor and the second conductor configured to substantially electrically insulate the first conductor and the second conductor at the intersection of the first conductor and the second conductor.

35. A communication device comprising:

a substrate having a support surface;

a first conductor comprising a polymer thick film over the support surface; and a second conductor over the support surface and intersecting the first conductor to couple respective areas adjacent opposite sides of the first conductor and to define an intersection; wherein the second conductor is substantially electrically insulated from the first conductor at the intersection of the first conductor and the second conductor.

36. A method of forming a communication device comprising:

providing a substrate;

providing a first conductor over the substrate;

providing a second conductor over the substrate configured to electrically couple respective areas adjacent opposite sides of the first conductor; and substantially electrically insulating the first conductor and the second conductor intermediate the areas, the insulating step comprising providing a dielectric layer intermediate the first conductor and the second conductor.

37. A method of forming a communication device comprising:

providing a substrate;

providing a first conductor comprising a polymer thick film over the substrate;

providing a second conductor over the substrate configured to electrically couple respective areas adjacent opposite sides of the first conductor; and substantially electrically insulating the first conductor and the second conductor intermediate the areas.

38. A method of forming a communication device comprising:

providing a substrate;

providing a conductor over the substrate;

providing a conductive adhesive over at least one portion of the substrate to electrically couple respective areas adjacent opposite sides of the conductor; and coupling an electrical component with at least one of the conductor and the conductive adhesive, wherein the step of providing the conductive adhesive comprises providing a first portion of the conductive adhesive over the conductor to electrically couple the respective areas adjacent opposite sides of the conductor, and the coupling comprises coupling the electrical component with a second portion of the conductive adhesive.

39. A method of forming a communication device comprising:

providing a substrate;

providing a conductor over the substrate;

providing a conductive adhesive over at least one portion of the substrate to electrically couple respective areas adjacent opposite sides of the conductor;

providing a dielectric layer intermediate the conductor and the conductive adhesive and intermediate the respective areas adjacent the opposite sides; and coupling an electrical component with at least one of the conductor and the conductive adhesive.

40. A method of forming a communication device comprising:

providing a substrate;

providing a conductor over the substrate;

providing a conductive adhesive over at least one portion of the substrate to electrically couple respective areas adjacent opposite sides of the conductor; and coupling an electrical component comprising wireless communication circuitry with at least one of the conductor and the conductive adhesive.

41. The method according to claim 40 wherein the coupling step comprises coupling an electrical component comprising radio frequency identification device communication circuitry.

42. A method of forming a communication device comprising:

providing a substrate;

providing a conductor comprising a polymer thick film over the substrate;

providing a conductive adhesive over at least one portion of the substrate to electrically couple respective areas adjacent opposite sides of the conductor; and coupling an electrical component with at least one of the conductor and the conductive adhesive.

* * * * *